(12) United States Patent
Sasada et al.

(10) Patent No.: US 9,977,203 B2
(45) Date of Patent: May 22, 2018

(54) PHOTOELECTRIC CONVERSION MODULE AND ACTIVE FIBER-OPTIC CABLE

(71) Applicant: HOSIDEN CORPORATION, Osaka (JP)

(72) Inventors: Kosuke Sasada, Osaka (JP); Takayuki Nagata, Osaka (JP)

(73) Assignee: HOSIDEN CORPORATION, Osaka (JP)

( * ) Notice: Subject to any disclaimer, the term of this patent is extended or adjusted under 35 U.S.C. 154(b) by 0 days. days.

(21) Appl. No.: 14/958,188

(22) Filed: Dec. 3, 2015

(65) Prior Publication Data

US 2016/0178862 A1 Jun. 23, 2016

(30) Foreign Application Priority Data

Dec. 19, 2014 (JP) .................................. 2014257749

(51) Int. Cl.
| | |
|---|---|
| G02B 6/12 | (2006.01) |
| G02B 6/36 | (2006.01) |
| G02B 6/00 | (2006.01) |
| G02B 6/42 | (2006.01) |
| H01L 31/02 | (2006.01) |
| H01L 31/0216 | (2014.01) |

(52) U.S. Cl.
CPC .......... *G02B 6/4277* (2013.01); *G02B 6/428* (2013.01); *G02B 6/4278* (2013.01); *G02B 6/4279* (2013.01); *H01L 31/02002* (2013.01); *H01L 31/02005* (2013.01); *H01L 31/02164* (2013.01)

(58) Field of Classification Search
CPC .. G02B 6/4277; G02B 6/4295; G02B 6/4278; H01S 5/0262; H01S 5/0265; H01S 5/026; H01L 31/02002; H01L 31/02164

USPC ...................... 385/14, 8, 53, 89, 92, 94, 139
See application file for complete search history.

(56) References Cited

U.S. PATENT DOCUMENTS

| 4,595,839 A * | 6/1986 | Braun .................. G02B 6/4202 |
| | | 250/227.24 |
| 6,720,826 B2 * | 4/2004 | Yoon ...................... H03F 3/087 |
| | | 250/214 A |
| 2001/0024551 A1 * | 9/2001 | Yonemura ............ G02B 6/4246 |
| | | 385/88 |
| 2002/0028048 A1 | 3/2002 | Dair et al. |

(Continued)

FOREIGN PATENT DOCUMENTS

| JP | 2003283261 A | 10/2003 |
| JP | 2012151233 A | 8/2012 |

OTHER PUBLICATIONS

Search Report dated Jul. 26, 2016 in European Application No. 15 19 7839.

*Primary Examiner* — Kaveh C Kianni
*Assistant Examiner* — Hung Lam
(74) *Attorney, Agent, or Firm* — Dilworth & Barrese, LLP.; Michael J. Musella, Esq.

(57) ABSTRACT

A photoelectric conversion module includes a substrate, a photoelectric conversion component mounted on the substrate, a wiring pattern formed on the substrate and electrically connected to the photoelectric conversion component, the wiring pattern having a power source line for supplying power to the photoelectric conversion component, a shield cover for covering the photoelectric conversion component, and a first filter inserted into the power source line in series.

2 Claims, 2 Drawing Sheets

(56) References Cited

U.S. PATENT DOCUMENTS

| | | | |
|---|---|---|---|
| 2002/0110338 A1* | 8/2002 | Dair | G02B 6/4246 |
| | | | 385/92 |
| 2007/0105445 A1* | 5/2007 | Manto | H05K 7/1497 |
| | | | 439/620.09 |
| 2007/0264022 A1* | 11/2007 | Hakomori | H01L 27/144 |
| | | | 398/138 |
| 2009/0120682 A1* | 5/2009 | Ohtsuji | H01R 13/648 |
| | | | 174/359 |
| 2012/0181535 A1 | 7/2012 | Ito et al. | |
| 2014/0140702 A1* | 5/2014 | Truong | H04B 10/2575 |
| | | | 398/115 |
| 2016/0191171 A1* | 6/2016 | Walker | H04B 10/5161 |
| | | | 398/183 |

* cited by examiner

PHOTOELECTRIC CONVERSION MODULE AND ACTIVE FIBER-OPTIC CABLE

REFERENCE TO RELATED APPLICATION

This application is based on and claims priority under 35 U.S.C. Section 119 to Japanese Patent Application No. 2014-257749 filed on Dec. 19, 2014, the entire content of which are incorporated herein by reference.

TECHNICAL FIELD

This disclosure relates to a photoelectric conversion module and an active fiber-optic cable.

RELATED ART

With an increasing demand of high-speed transmission of signals between devices, an electric-signal transmission system, which is unfavorable in noise and power consumption, progressively shifts to an optical-signal transmission system. Further, with increase of data volume transmitted via the optical-signal transmission system, multi-core fibers, which are optical fibers including a plurality of cores in a single clad, have been used for an optical communication line. Meanwhile, the industries in the field concerned have been actively developing the technology on photoelectric conversion devices, such as a laser diode (LD) and a photodiode (PD), which are optically coupled to an end of the multi-core fiber, to promote high-speed conversion between optical signals and electric signals.

A conventional photoelectric conversion module disclosed in Japanese Unexamined Patent Application Publication No. 2012-151233 includes an FPC substrate with electrode terminals provided on its back surface, a mirror element mounted on a front surface of the substrate, an optical fiber having four cores and disposed to face a mirror surface of the mirror element, a photoelectric conversion array device optically coupled to the optical fiber via the mirror surface and mounted on the back surface of the substrate, and an IC chip for driving the array device.

SUMMARY

Optical signals are substantially free from influence of electromagnetic waves, and thus the quality of communication is hardly impaired by external electric noise ("noise" hereinafter). On the other hand, electric signals obtained via photoelectric conversion or electric signals before converted to optical signals via photoelectric conversion are easily disturbed by noise, which needs precautions against electromagnetic interference (EMI). Nonetheless, the photoelectric conversion module disclosed in the above Japanese patent application provides no countermeasures against EMI.

Another conventional photoelectric conversion module disclosed in Japanese Unexamined Patent Application Publication No. 2003-283261 proposes some countermeasures against EMI. More particularly, this conventional light-receiving module includes a light-receiving device for converting an optical signal emitted from an optical fiber to an electric signal, a pre-amplifier connected to an output of the light-receiving device and including an amplifier section and a transimpedance section, a low-pass filter (LPF) including a resister and a capacitor, and a primary amplifier. The LPF removes high harmonic-wave noise components, which are superimposed on an electric signal converted from an optical signal to counter EMI.

On the other hand, JP 2003-283261 discloses that the LPF is inserted in the middle of a signal line conveying the electric signal having photoelectrically converted from the optical signal by the light-receiving device. Such an arrangement with the LPF inserted into the signal line for transmitting the signal in high speed would disadvantageously cause loss in electric-signal transmission. Further, no filter is provided for noise reduction for broad-band transmission with a transmission bandwidth of 100 G bps, for example.

This disclosure relates to a photoelectric conversion module and an active fiber-optic cable including the photoelectric conversion module, which can counter EMI without causing any loss in electric-signal transmission.

According to one embodiment of the present invention, a photoelectric conversion module includes a substrate, a photoelectric conversion component mounted on the substrate, a wiring pattern formed on the substrate and electrically connected to the photoelectric conversion component, the wiring pattern including a power source line for supplying power to the photoelectric conversion component, a shield cover for covering the photoelectric conversion component, and a first filter inserted into the power source line in series.

In an active fiber-optic cable, electromagnetic interference (EMI) is typically caused by noise riding on a signal line from a power line or a grounding line, or high harmonic-wave noise riding on the power line or the grounding line from the signal line. With the above arrangement, the noise on the power source line is canceled by the first filter, as a result of which the noise on the signal line is reduced. Similarly, the high harmonic-wave noise riding on the power source line from the signal line is canceled by the first filter.

According to one embodiment of the present invention, the first filter is covered with the shield cover.

The above arrangement allows the noise radiated within the shield cover to ride on the power source line without leaking outside the shield cover. Thus, the noise can be canceled by the first filter. Moreover, the noise on a line that is connected, outside the shield cover, to the power source line is also canceled by the first filter, which prevents the noise from riding on the signal line to prevent an adverse effect of the noise on the photoelectric conversion components.

According to one embodiment of the present invention, the wiring pattern includes a grounding line for grounding the photoelectric conversion component, and the module further includes a second filter inserted into the grounding line in series.

With the above arrangement, not only the noise on the power source line but also the noise on the grounding line is canceled by the second filter, which prevents the noise from riding on the signal line. Additionally, the high harmonic-wave noise riding on the grounding line from the signal line is canceled by the second filter inserted to the grounding line.

According to one embodiment of the present invention, the second filter is covered with the shield cover.

The above arrangement allows the noise radiated within the shield cover to ride on the grounding line without leaking outside the shield cover. Thus, the noise can be canceled by the second filter. Moreover, the noise on a line that is connected, outside the shield cover, to the grounding line is also canceled by the second filter, which prevents the noise from riding on the signal line to prevent an adverse effect of the noise on the photoelectric conversion components.

According to one embodiment of the present invention, an active fiber-optic cable is connected to the photoelectric conversion module of any one of the above embodiments to be optically coupled to at least one end of an optical fiber.

The above arrangement effectively removes the noise on the signal line as well as on the power source line or the grounding line without causing any signal-transmission loss.

DESCRIPTION OF EMBODIMENTS

An optical transmitter 10, a photoreceptor 30, and an active fiber-optic cable 1 will be described hereinafter in detail in reference to the accompanying drawings. The optical transmitter 10 and the photoreceptor 30 are examples of a photoelectric conversion module.

Figure 1:
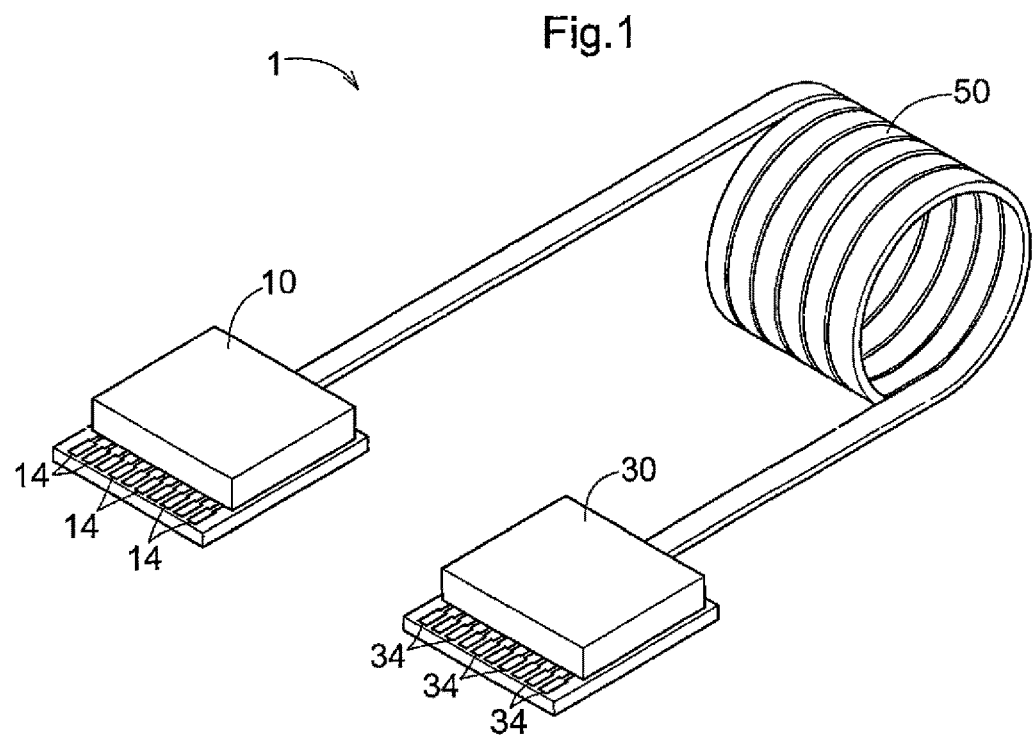
FIG. 1 is a schematic perspective view of an active fiber-optic cable according to one embodiment of the present invention.

Referring to FIG. 1, the active fiber-optic cable 1 includes a four-core multi-mode optical fiber array 50 with a bundle of four cores. The optical transmitter 10 is coupled to one end of the optical fiber array 50, and the photoreceptor 30 is coupled to the other end of the optical fiber array 50. The optical transmitter 10 has electrode terminals 14 at an end opposite to the optical fiber array 50, and the photoreceptor 30 has electrode terminals 34 at an end opposite to the optical fiber array 50. The electrode terminals 14 and 34 are electrically connected to unillustrated devices. The optical fiber array 50 is an example of an optical fiber.

Figure 2:
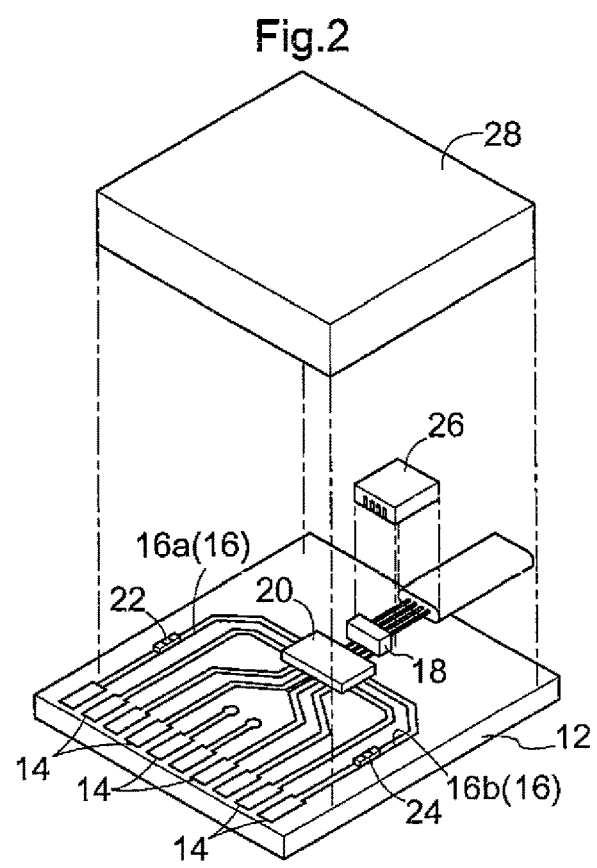
FIG. 2 is a schematic exploded perspective view of an optical transmitter according to the embodiment of the present invention.

Referring to FIG. 2, the optical transmitter 10 further includes a substrate 12 having an insulator made of resin, for example. The plurality of electrode terminals 14 made of conductive metal such as copper are formed on the substrate 12 through a conventional technique such as etching. On the substrate 12 are also mounted an LD array 18 with four built-in laser diodes (LD) for converting an electric signal to an optical signal, and a driver 20 for driving the LD array 18. The four cores of the optical fiber array 50 are optically coupled to the LD array 18 at their first ends.

Electric connection is established between the LD array 18 and the driver 20 and between the driver 20 and each of the electrode terminals 14 via a wiring pattern 16 made of conductive metal and formed on the substrate 12 through a conventional technique such as etching. The LD array 18 and the driver 20 are examples of a photoelectric conversion component. While the LD array 18 is separate from the driver 20 in the current embodiment, a single package may have both the elements built-in.

The optical fiber array 50 is mounted on the substrate 12. The cores are exposed at the first end of the optical fiber array 50, and fixed to be arranged parallel to each other by a fiber retainer 26.

Figure 3:
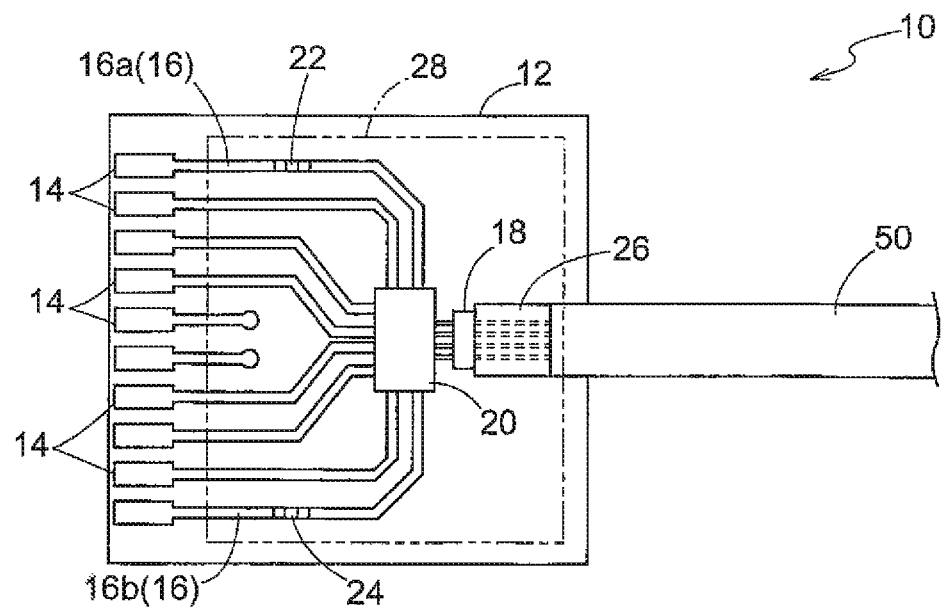
FIG. 3 is a schematic top plan view of the optical transmitter.

Referring to FIGS. 2 and 3, a shield cover 28 made of metal such as iron is provided on a side of the substrate 12 having the LD array 18 and the driver 20. The shield cover 28 is fixed to the substrate 12 through a conventional technique such as adhesion. The shield cover 28 prevents external noise from adversely affecting the LD array 18 and the driver 20 or prevents internal noise generated inside the shield cover 28 from radiating to the outside.

In the optical transmitter 10, a first low-pass filter (LPF) 22 is inserted in series in a power source line 16a of the wiring pattern 16 for supplying power to the driver 20. The first LPF 22 is mounted within an area covered with the shield cover 28. The first LPF 22 is an example of a first filter.

Further, a second low-pass filter (LPF) 24 is inserted in series in a grounding line 16b of the wiring pattern 16 for grounding the driver 20. The second LPF 24 is also mounted within the area covered with the shield cover 28. The constructions of the first LPF 22 and the second LPF 24 are already known, and will not be described any further. The second LPF 24 is an example of a second filter.

Figure 4:
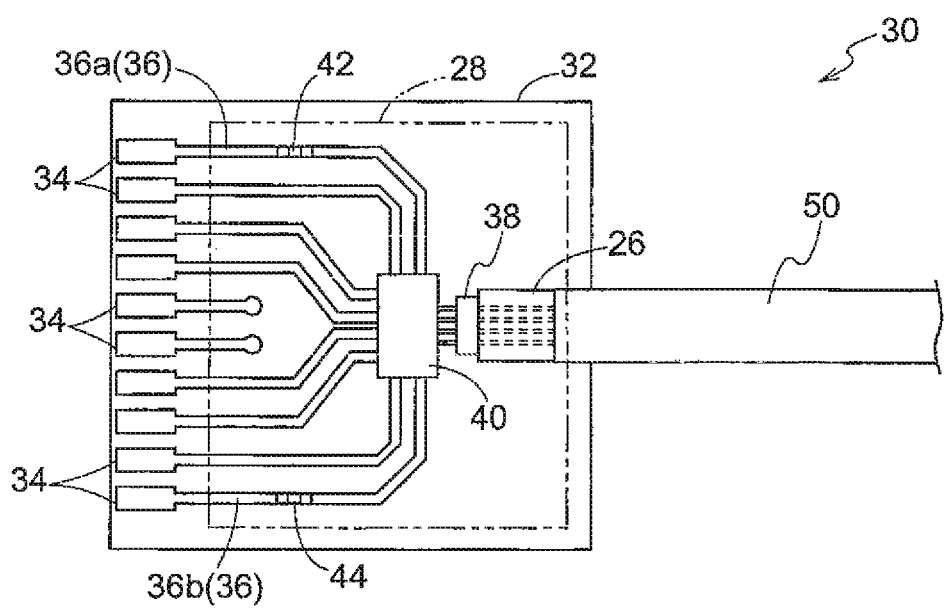
FIG. 4 is a schematic top plan view of a photoreceptor.

Referring to FIG. 4, the photoreceptor 30 is analogous to the optical transmitter 10 in construction. More particularly, the plurality of electrode terminals 34 made of conductive metal such as copper are formed on a substrate 32 having an insulator made of resin, for example, through a conventional technique such as etching. On the substrate 32 are also mounted a PD array 38 with four built-in photodiodes (PD) for converting an optical signal to an electric signal, and an amplifier 40 for amplifying the electric signal outputted from the PD array 38. The four cores of the optical fiber array 50 are optically coupled to the PD array 38 at their second ends.

Electric connection is established between the PD array 38 and the amplifier 40 and between the amplifier 40 and each of the electrode terminals 34 via a wiring pattern 36 made of conductive metal and formed on the substrate 32 through a conventional technique such as etching. The PD array 38 and the amplifier 40 are examples of the photoelectric conversion component. While the PD array 38 is separate from the amplifier 40 in the current embodiment, a single package may have both the elements built-in.

The optical fiber array 50 is mounted on the substrate 32. The cores are exposed at the second end of the optical fiber array 50, and fixed to be arranged parallel to each other by a fiber retainer 26.

A shield cover 28 made of metal such as iron is provided on a side of the substrate 32 having the PD array 38 and the amplifier 40. The shield cover 28 is fixed to the substrate 32 through a conventional technique such as adhesion.

In the photoreceptor 30, a third low-pass filter (LPF) 42 is inserted in series in a power source line 36a of the wiring pattern 36 for supplying power to the amplifier 40. The third LPF 42 is mounted within an area covered with the shield cover 28. The third LPF 42 is an example of the first filter.

Further, a fourth low-pass filter (LPF) 44 is inserted in series in a grounding line 36b of the wiring pattern 36 for grounding the amplifier 40. The fourth LPF 44 is also mounted within the area covered with the shield cover 28. The constructions of the third LPF 42 and the fourth LPF 44 are already known, and thus will not be described any further. The fourth LPF 44 is an example of the second filter.

In the active fiber-optic cable 1, electromagnetic interference (EMI) is typically caused by noise riding on a signal line from the power lines 16a and 36a or the grounding lines 16b and 36b, or high harmonic-wave noise riding on the power lines 16a and 36a or the grounding lines 16b and 36b from the signal line. To address such unfavorable situations, the first LPF 22 and the second LPF 24 are inserted into the power source line 16a and the grounding line 16b, respectively, in the optical transmitter 10 as in the current embodiment, and the third LPF 42 and the fourth LPF 44 are inserted into the power source line 36a and the grounding line 36b, respectively, in the photoreceptor 30 as in the current embodiment. With such an arrangement, the noise on the power source lines 16a and 36a or the grounding lines 16b and 36b is canceled by the first LPF 22, the second LPF 24, the third LPF 42 and the fourth LPF 44, as a result of which the noise on the signal line is reduced. Similarly, the high harmonic-wave noise riding on the power source lines 16a and 36a or the grounding lines 16b and 36b from the signal line is canceled by the first LPF 22, the second LPF 24, the third LPF 42 and the fourth LPF 44.

Further, the first LPF 22, the second LPF 24, the third LPF 42 and the fourth LPF 44 are mounted inside the shield cover 28, which allows the noise radiated within the shield cover 28 to ride on the power source lines 16a and 36a or the grounding lines 16b and 36b without leaking outside the shield cover 28. Thus, the noise can be canceled by the first LPF 22, the second LPF 24, the third LPF 42 and the fourth LPF 44. Moreover, the noise on a line that is connected, outside the shield cover 28, to the power source lines 16a and 36a or the grounding lines 16b and 36b is also canceled by the first LPF 22, the second LPF 24, the third LPF 42 and the fourth LPF 44, which prevents the noise from riding on the signal line to prevent an adverse effect of the noise on the driver 20, the LD array 18, the amplifier 40 and the PD array 38.

The active fiber-optic cable 1 including the optical transmitter 10 and the photoreceptor 30 configured as above can effectively remove the noise on the signal line as well as on the power source lines 16a and 36a or the grounding lines 16b and 36b without causing any signal-transmission loss.

In the above embodiment, the low-pass filters are used for the first LPF 22, the second LPF 24, the third LPF 42 and the fourth LPF 44, but may be replaced by any other filter. For example, bandpass filters may be used instead of the low-pass filters.

In the above embodiment, the low-pass filters are inserted into both the optical transmitter 10 and the photoreceptor 30. Alternatively, the low-pass filters may be inserted into only one of the optical transmitter 10 and the photoreceptor 30.

In the above embodiment, the low-pass filters are inserted into both the power source line 16a or 36a and the grounding line 16b or 36b. Alternatively, the low-pass filter may be inserted into only one of the power source line 16a or 36a and the grounding line 16b or 36b. Further, the arrangement may include the optical transmitter 10 receiving the first LPF 22, and the photoreceptor 30 receiving the fourth LPF 44, or may include the optical transmitter 10 receiving the second LPF 24, and the photoreceptor 30 receiving the third LPF 42.

What is claimed is:

1. A photoelectric conversion module including only one of an optical transmitter and a photoreceptor, the module comprising:
    a substrate;
    a photoelectric conversion component mounted on the substrate;
    a wiring pattern formed on the substrate and electrically connected to the photoelectric conversion component, the wiring pattern including a power source line for supplying power to the photoelectric conversion component;
    a shield cover for covering the photoelectric conversion component; and
    a first filter inserted into the power source line in series for canceling noise on the power source line,
    wherein the first filter is covered with the shield cover,
    wherein the photoelectric conversion component has only one of a function of converting an electric signal to an optical signal in the optical transmitter and a function of converting an optical signal to an electric signal in the photoreceptor, and
    wherein the shield cover is mounted on the substrate and is made of metal, thereby preventing noise from the outside from adversely affecting the photoelectric conversion component or preventing noise from the inside from radiating to the outside,
    wherein the wiring pattern includes a grounding line for grounding the photoelectric conversion component, the module further comprises a second filter inserted into the grounding line in series, and the second filter is covered with the shield cover for canceling noise on the grounding line.

2. An active fiber-optic cable connected to the photoelectric conversion module according to claim 1 to be optically coupled to at least one end of an optical fiber.

* * * * *